United States Patent [19]

Reuschel et al.

[11] 3,950,479

[45] *Apr. 13, 1976

[54] METHOD OF PRODUCING HOLLOW SEMICONDUCTOR BODIES

[75] Inventors: Konrad Reuschel, Vaterstetten; Arno Kersting, Erlangen; Wolfgang Keller, Pretzfeld, all of Germany

[73] Assignee: Siemens Aktiengesellschaft, Munich, Erlangen, Berlin, Germany

[ * ] Notice: The portion of the term of this patent subsequent to Aug. 7, 1990, has been disclaimed.

[22] Filed: Feb. 12, 1973

[21] Appl. No.: 331,501

Related U.S. Application Data

[63] Continuation of Ser. No. 192,672, Oct. 26, 1971, Pat. No. 3,751,539, which is a continuation-in-part of Ser. No. 826,249, May 20, 1969, abandoned.

[30] Foreign Application Priority Data

Apr. 2, 1969 Germany............................ 1917016

[52] U.S. Cl. ............... 264/248; 156/242; 228/196; 228/263; 264/81; 427/51; 427/86; 427/87; 427/249
[51] Int. Cl.² B29D 23/00; B01J 17/32; B29C 24/00; B29D 31/00
[58] Field of Search ........... 156/232, 233, 235, 242, 156/249, 247, 231; 117/106 A; 148/174, 175; 264/81, 59, 248; 29/470; 427/51, 86, 87, 249; 228/196, 263

[56] References Cited
UNITED STATES PATENTS

| | | | |
|---|---|---|---|
| 2,840,489 | 6/1958 | Kempter et al. ................ | 117/106 A |
| 3,139,363 | 6/1964 | Baldrey............................. | 264/81 |
| 3,303,549 | 2/1967 | Peyser............................. | 29/470 X |
| 3,433,686 | 3/1969 | Marinace .......................... | 148/175 |
| 3,436,255 | 4/1969 | Harris et al...................... | 117/106 A |
| 3,477,885 | 11/1969 | Henker......................... | 117/106 A X |
| 3,574,006 | 4/1971 | Dersin et al. ............... | 117/106 A X |
| 3,658,585 | 4/1972 | Folkmann et al............... | 117/106 A |
| 3,686,378 | 8/1972 | Dietze................................. | 264/81 |
| 3,717,498 | 2/1973 | Franz et al...................... | 117/106 A |
| 3,746,496 | 7/1973 | Dietze et al...................... | 264/81 X |
| 3,751,539 | 8/1973 | Reuschel et al. ..................... | 264/81 |

*Primary Examiner*—Douglas J. Drummond
*Assistant Examiner*—Thomas Bokan
*Attorney, Agent, or Firm*—Herbert L. Lerner

[57] ABSTRACT

Described are two methods of producing a hollow body, comprised of semiconductor material, especially silicon, by precipitation from a gaseous compound of said semiconductor material upon the surface of a heated carrier body, which after a sufficiently thick layer of semiconductor material has been precipitated, is removed again without damaging said layer. One method is characterized by using a hollow carrier body, open at least at two opposite sides. In one embodiment, prior to the precipitation of the semiconductor material, one of the open sides of the carrier body is covered by a wafer from the same semiconductor material whose shape corresponds to the open side. Thereafter, the semiconductor material is precipitated from the gaseous compound until the desired layer thickness and a gas-tight connection is obtained between the layer and the covering semiconductor material. The second method precipitates a semiconductor layer and thereafter welds a cover on one or both open ends the tube.

7 Claims, 1 Drawing Figure

U.S. Patent  April 13, 1976  3,950,479
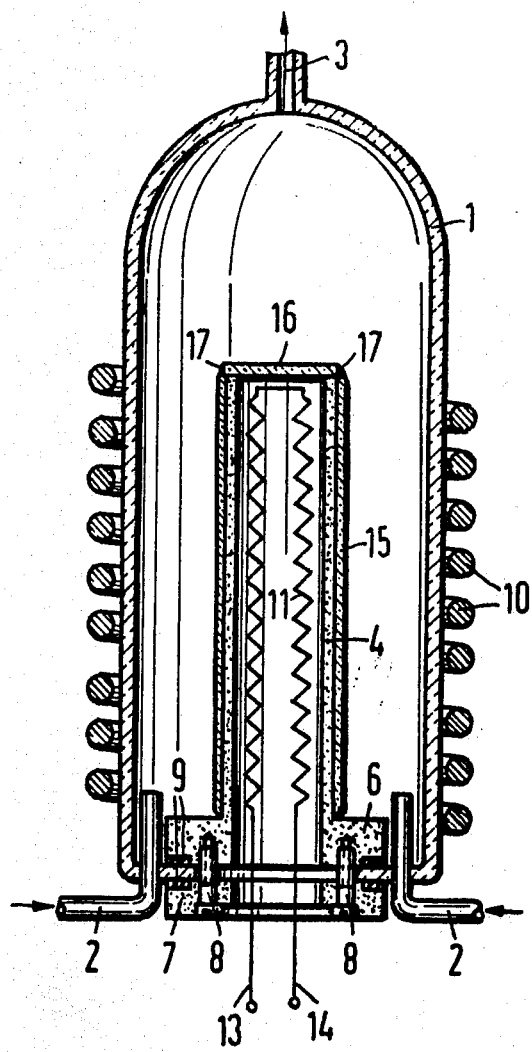

METHOD OF PRODUCING HOLLOW SEMICONDUCTOR BODIES

This is a continuation of application Ser. No. 192,672, filed Oct. 26, 1971, now U.S. Pat. No. 3,751,539, which in turn is a continuation-in-part of application Ser. No. 826,249, filed May 20, 1969 now abandoned.

Our invention relates to a method for producing a hollow body of semiconductor material, particularly silicon by precipitation, from a gaseous compound of said semiconductor material, upon the surface of a heated carrier body. After deposition of a sufficiently thick layer of semiconductor material, the heated carrier is removed without damaging the semiconductor layer.

Such a method had already been suggested. The known process makes it possible to produce, at two opposite sides, open hollow bodies, e.g. of silicon. The carrier body can then be easily removed, for example through burning out or by boring. The burning out technique is tedious and difficult in hollow bodies which are open only on one side. The boring technique entails the danger that the bored hole will damage the side of the hollow body lying opposite the open side, if the portion of the carrier body, adjacent to that side is to be removed.

Our invention provides two ways in which a hollow body can be produced from a semiconductor material, particularly silicon. The new method facilitates the removal of the carrier body, without danger of damaging the hollow body, even when the latter is open on only one side.

Our first solution is so characterized that a hollow carrier body, open at least at two opposite sides, is used. Prior to precipitating the semiconductor material, one of the open sides of the carrier body is covered by a wafer of the same semiconductor material whose shape is adjusted to the shape of the open side. The semiconductor material is precipitated thereon, from the gaseous compound, until the desired layer thickness of at least 0.5 mm and a gas-tight connection is obtained between the precipitated layer and the semiconductor material cover.

The second solution lies in the fact that a hollow carrier body, open at least on two opposite sides, is used. The semiconductor material is precipitated from the gaseous compound until the desired layer thickness is obtained and that, subsequently, a wafer of solid semiconductor material, whose shape is adjusted to the shape of the open side, is welded in a vacuum or in protective gas, to the precipitated semiconductor material.

If the first described solution is to be used for producing a one-sided sealed tube with circular cross section, it is preferable to use a tubular carrier body and to place the wafer of solid semiconductor material upon the front face of the carrier body whereby the diameter of the wafer is larger than the inner diameter but smaller than the outer diameter of the tubular carrier body.

If it is desired to produce a unilaterally sealed tube with tubular cross-section, according to the second solution, the diameter of the wafer is preferably selected to be at least as large as the inner diameter of the tubular carrier body. The method according to the second solution is preferably used for producing a tube, sealed on both sides. Following the precipitation of the semiconductor material and the removal of the carrier body, a second wafer of semiconductor material is welded upon the still open front face of the tube with the precipitated semiconductor material, in a vacuum, for example with high frequency energy.

The invention will now be disclosed in two embodiment examples as shown in the single FIGURE, which shows a device for precipitating a layer of semiconductor material.

A quartz bell 1 is used as a reaction vessel. The bottom of the bell is provided with two inlet tubes 2 and the top of the bell is provided with an outlet opening 3. The quartz bell contains a carrier body 4, for example graphite and provided with a foot 6 that is attached on the bottom of the quartz bell 1, with the aid of a ring 7 and screws 8. Suitable as a carrier material are any of graphite, compressed graphite, anthracite, glass coal and pyrographite. All of the above materials are simply called "graphite" hereinbelow. Sealing rings 9, installed in the foot of the carrier body and in the ring 7, seal the interior of the quartz bell against the atmosphere. A heating coil 11, arranged in the carrier body 4, is connected to a voltage source, via leads 13 and 14.

The method is carried out as follows. A wafer is placed upon the front face of the carrier body 4. This wafer is comprised of the same semiconductor material, which is to be precipitated from a gaseous compound upon the carrier body 4. The wafer is denoted as 16 and is comprised of silicon if the hollow body is of silicon. It is preferable to select the diameter of the wafer 16 somewhat smaller than the desired outer diameter of the tube. Subsequently, the quartz bell is hermetically sealed, with the aid of the ring 7 and the screws 8. The carrier body 4 is then heated by applying voltage to the heating coil 11. The carrier body can also be heated inductively. A coil 10 is placed around the quartz bell 1 and a high-frequency current is passed therethrough for inductive heating.

When the carrier body is heated, a gaseous compound of the semiconductor material is passed through the tubes 2 into the quartz bell. In the case of silicon, silicochloroform $SiHCl_3$ or silicon tetrachloride $SiCl_4$ is used for example. Thermal dissociation causes crystalline silicon to precipitate at the carrier body 4. The deposited silicon layer 15 grows, very gradually, together with the cover wafer 16, whereby silicon also precipitates at the places indicated as 17, drawn in thick, black lines. The precipitation of silicon at the carrier body comes to an end when, firstly, the thickness of layer 15 is adequate and, secondly, when a gas-tight end mechanically stable connection is obtained between the layer 15 and the cover wafer 16. The carrier body can then be removed by a milling process after it has been removed from the bell 1. Preferably, however, the graphite carbon body is removed by simply pulling it out from the silicon body which has a different coefficient of expansion or contraction from the graphite carrier, and thus separates therefrom upon cooling. The difference in the thermal coefficient of the graphite carrier and the semiconductor body, such as silicon, germanium, silicon carbide, etc., makes it easy to remove the graphite carrier body.

When the second solution according to the invention is employed, the same apparatus can be used. The carrier body 4 is heated as in the first example. After the gaseous compound of the semiconductor material is introduced, the same is precipitated on the heated surface, i.e. on the wall of the carrier body 4. When the silicon layer has become sufficiently thick, the precipitation is terminated and the carrier body with the silicon layer is removed from the bell. A silicon wafer is seated upon the front face of carrier body 4. The diameter of said silicon wafer is at least equal to the inner diameter of the silicon tube. The silicon wafer is then welded in a vacuum, at high frequency, with the silicon layer 15, in a device which is not described in detail. The welding can be carried out by heating both the silicon wafer and the silicon layer to a temperature at which they melt. The melting can be by high frequency heating as used in the semiconductor art. The carrier body 4 can be removed, subsequently, if this was not done prior to the welding of both parts, and can easily be effected when the second method according to the invention is employed. The welding also affords a gas-tight and mechanically stable connection. Welding can also be effected with the aid of electron beams in a high vacuum or by plasma jets in a protective gas.

A feasible method for welding a silicon wafer with a silicon tube is carried out so that the silicon tube and the applied silicon wafer are placed into a vacuum tight vessel where a high frequency coil is provided. This high frequency coil has an inner diameter which is larger than the outer diameter of the tube and of the wafer. The tube is positioned eccentrically to the coil. A high frequency alternating voltage with a frequency of 4 MHz, e.g. is applied to the coil. The required capacity, depending on the diameter of the tube (20 to 60 mm) is approximately 2 to 5 kW. Now, the part of the tube and the lid, which are closest to the coil, is melted so that lid and tube are joined at this place. The tube is then rotated at an rpm of e.g. 5 min$^{-1}$, so that the molten zone migrates along the circumference of the tube and the lid and the lid becomes welded all around, with the tube. Preferably, a temperature between 1400° to 1450°C is selected for silicon.

One of the tubes produced according to the invention had a wall thickness of 2 mm and an outer diameter of about 45 mm. The thickness of the wafer 16 was also 2 mm. The carrier body was heated to a temperature between 1160° and 1220°C. The weight rate of flow of the silicochloroform/hydrogen mixture was about 500 liter per hour, at a mole ratio of about 0.15 silicochloroform/hydrogen. The rate of precipitation is approximately 0.1 g/cm$^2$h. The wall thickness was then about 2 mm. The tube with the carrier body was then cooled for about one-fourth to one-half hour, whereupon the unilaterally sealed silicon tube may be pulled upward.

The second method can also be used for the purpose of sealing, completely, a hollow body comprised of semiconductor material. To this end, the carrier body must, naturally, be previously removed.

The invention is not limited to the production of hollow bodies comprised of silicon. It is also possible to produce hollow bodies of other semiconductor materials, such as germanium, silicon carbide, tungsten-carbide, $A^{III}B^V$ compounds and $A^{II}B^{VI}$ compounds. If a hollow body is to be produced of silicon carbide, then the gaseous compound which is used, constitutes for example $CH_3SiCl_3$ and hydrogen. If, for example, the hollow body is to be comprised of boron nitride, then hexachloride borazol $B_3N_3Cl_6$ and hydrogen are used.

Silicon is, preferably, precipitated at 1100° to 1200°C; germanium preferably at 700° to 800°C and silicon carbide, preferably, at 1300° to 1400°C. It is recommendable to establish the throughput rate between 0.05 and 5 liter per hour and cm$^2$ of surface to be precipitated. The mole ratio of the reduction gas hydrogen to the gaseous compound of the semiconductor material amounts in silicon trichloride $SiHCl_3$, preferably to 1:0.015–1:1.3; in silicon tetrachloride $SiCl_4$ preferably to 1:0.01–1:0.2 and in germanium tetrachloride $GeCl_4$, preferably to 1:0.1–1:0.4. As a rule, a precipitation period of 3 to 10 hours, produced a wall thickness for the tube ranging between 0.5 and 5 mm, depending on the throughput and on the mole ratio.

All these semiconductors are very hard and brittle and are also resistant to high temperatures and are gas-tight. They are, therefore, suitable as reaction vessels for reactions which take place at high temperatures. An example of such a reaction is the diffusion process in silicon wafers. The quartz ampules used heretofore, for diffusion purposes, can only withstand temperatures of about 1200°C.

Ampules comprised of silicon or another one of the indicated semiconductor materials can increase the temperatures considerably and this accelerates the diffusion process. Moreover, there is no longer a danger as before that if quartz is used as a reaction vessel, impurities contained in said reaction vessel will diffuse into the silicon wafers, since the precipitated semiconductor material, more particularly silicon, can be produced in a very pure form.

What is claimed is:

1. Method of producing a hollow tubular body closed on at least one end, comprised of semiconductor material selected from the group consisting of silicon, germanium, silicon carbide, an $A^{III}B^V$ compound and an $A^{II}B^{VI}$ compound, by precipitation from a gaseous compound of said semiconductor material upon the surface of a heated graphite tubular carrier body open at two opposite sides to precipitate a tubular layer of semiconductor material of a thickness of at least 0.5 mm., removing said carrier body without damaging said layer, and welding a solid wafer of the same semiconductor material as that precipitated, whose size is adjusted to an open end of the tubular layer, to the precipitated semiconductor material in a vacuum or a protective gas.

2. The method of claim 1, wherein silicon is the semiconductor material.

3. The method of claim 2, wherein a tubular carrier body is used and the wafer, of solid semiconductor material, is arranged on an open end of the carrier body, whereby the diameter of said wafer is at least as large as the inner diameter of the tubular carrier body.

4. The method of claim 3, wherein the carrier body is removed prior to the welding of the wafer and precipitated material.

5. The method of claim 4, for producing a tube sealed on both sides, wherein after precipitation of the semiconductor material and the removal of the carrier body, another wafer is arranged at the still open end of the tube and welded with the semiconductor material in a vacuum or in protective gas.

6. The method of claim 5, wherein the thickness of said another wafer is from one-half to 2 times the thickness of the precipitated material and the diameter of the wafer is between the inside and outside diameter of the tube.

7. The method of claim 6, wherein the semiconductor compound is selected from the group consisting of silicon tetrachloride and silicochloroform and wherein said precipitation of the semiconductor material is at a temperature of 1100°–1200°C.

* * * * *